United States Patent
Jiroku (10) Patent No.: US 9,343,501 B2
(45) Date of Patent: May 17, 2016

(54) PHOTOELECTRIC CONVERSION APPARATUS, MANUFACTURING METHOD OF PHOTOELECTRIC CONVERSION APPARATUS, AND ELECTRONIC DEVICE

(71) Applicant: SEIKO EPSON CORPORATION, Tokyo (JP)

(72) Inventor: Hiroaki Jiroku, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/629,071

(22) Filed: Feb. 23, 2015

(65) Prior Publication Data

US 2015/0249106 A1    Sep. 3, 2015

(30) Foreign Application Priority Data

Feb. 28, 2014 (JP) ................. 2014-038188

(51) Int. Cl.
 H01L 27/146 (2006.01)
 H01L 31/032 (2006.01)
 H01L 31/0224 (2006.01)
 H01L 31/18 (2006.01)
 H04N 3/14 (2006.01)

(52) U.S. Cl.
 CPC .... *H01L 27/14643* (2013.01); *H01L 27/14612* (2013.01); *H01L 27/14623* (2013.01); *H01L 27/14632* (2013.01); *H01L 27/14685* (2013.01); *H01L 27/14687* (2013.01); *H01L 27/14689* (2013.01); *H01L 31/022408* (2013.01); *H01L 31/0322* (2013.01); *H01L 31/18* (2013.01); *H04N 3/155* (2013.01)

(58) Field of Classification Search
None
See application file for complete search history.

(56) References Cited

U.S. PATENT DOCUMENTS

| | | | |
|---|---|---|---|
| 2006/0011808 A1* | 1/2006 | Li | H01L 27/14623 250/208.1 |
| 2011/0024859 A1* | 2/2011 | Miyazaki | H01L 27/14645 257/432 |
| 2012/0205649 A1 | 8/2012 | Hattori et al. | |
| 2013/0001724 A1* | 1/2013 | Masuda | H01L 27/14623 257/432 |
| 2014/0077321 A1 | 3/2014 | Miyata et al. | |

FOREIGN PATENT DOCUMENTS

| | | | | |
|---|---|---|---|---|
| EP | 2490264 A1 * | 8/2012 | ........ | H01L 27/14632 |
| JP | 2012-169517 A | 9/2012 | | |
| JP | 2014-204053 A | 10/2014 | | |

OTHER PUBLICATIONS

The Extended European Search Report for the corresponding European Application No. 15156780.7 dated Jul. 30, 2015.

* cited by examiner

*Primary Examiner* — Charles Garber
*Assistant Examiner* — Steven Christopher
(74) *Attorney, Agent, or Firm* — Global IP Counselors, LLP (57) ABSTRACT

A photoelectric conversion apparatus includes a TFT 10 provided on one surface of a substrate 1, a second interlayer insulation film 7 provided so as to cover the TFT 10, a shading film 9 provided on the second interlayer insulation film 7 in an area overlapping the TFT 10 when seen from a thickness direction of films that are formed on the substrate 1, a lower electrode 8 provided on the second interlayer insulation film 7, and a semiconductor film 21 having a chalcopyrite structure provided on the lower electrode 8. A group 16 element is included in the shading film 9, the lower electrode 8 and the semiconductor film 21.

4 Claims, 6 Drawing Sheets

PHOTOELECTRIC CONVERSION APPARATUS, MANUFACTURING METHOD OF PHOTOELECTRIC CONVERSION APPARATUS, AND ELECTRONIC DEVICE

This application claims a priority to Japanese Patent Application No. 2014-038188 filed on Feb. 28, 2014 which is hereby expressly incorporated by reference in its entirety.

BACKGROUND

1. Technical Field

Several aspects of the present invention relate to a photoelectric conversion apparatus, a manufacturing method of the photoelectric conversion apparatus, and an electronic device.

2. Related Art

Heretofore, photoelectric conversion apparatuses that are provided with a switching element realized by a thin film transistor that is formed on a substrate and a photoelectric conversion part consisting of a semiconductor film having a chalcopyrite structure that is connected to the switching element are known.

A compound semiconductor thin film that is constituted to include group 11 elements, group 13 elements and group 16 elements is used for the semiconductor film having a chalcopyrite structure. The photoelectric conversion part is constituted by forming this compound semiconductor thin film into a p-type semiconductor film, and forming a p-n junction with an n-type semiconductor film.

In the above 11-13-16 group compound semiconductor, a $CuInSe_2$ film (so-called CIS film) including copper (Cu), indium (In) and selenium (Se), or a $Cu(In,Ga)Se_2$ film (so-called CIGS film) including Cu, In, gallium (Ga) and Se is used. The CIS film is formed by annealing a metal film including Cu and In in a Se atmosphere at about 500° C. The CIGS film is similarly formed by annealing a metal film including Cu, In and Ga in a Se atmosphere.

For example, JP-A-2012-169517 (FIG. 3) discloses an image sensor serving as a photoelectric conversion apparatus in which thin film transistors and the like are formed on a substrate as a circuit part, and photoelectric conversion parts using the abovementioned CIGS film are laminated on the circuit part.

However, there is a problem with the photoelectric conversion apparatus disclosed in JP-A-2012-169517 in that a desired image cannot be obtained due to stray light.

More specifically, with the photoelectric conversion apparatus disclosed in JP-A-2012-169517, when light is incident on the photoelectric conversion apparatus, leakage current flows in the thin film transistors of the circuit part upon light (stray light) being incident on the thin film transistors, causing the circuit to malfunction, and thus a desired image cannot be obtained. In view of this, a shading film is formed by covering the thin film transistors with a metal film, in order to prevent stray light from being incident on the thin film transistors. However, there is a problem in using a metal film as the shading film for preventing stray light from being incident on the thin film transistors. When a metal film is used as the shading film, much of the light incident on the shading film is reflected. The light reflected by the shading film becomes stray light, and is incident on the photoelectric conversion parts directly or after being multiply reflected. When light is incident on photoelectric conversion parts that are at different locations from the photoelectric conversion part on which the light was originally supposed to be incident, the circuit mal-functions, and a desired image cannot be obtained. In view of this, a photoelectric conversion apparatus that is able to obtain desired images is desired.

SUMMARY

Advantages of some aspects of the invention can be realized as the following illustrative embodiments or application examples.

Application Example 1

A photoelectric conversion apparatus according to the present application example includes a switching element provided on one surface of a substrate, an interlayer insulation film provided so as to cover the switching element, a shading film provided on the interlayer insulation film in an area overlapping the switching element when seen from a film thickness direction of the substrate, a lower electrode provided on the interlayer insulation film, and a semiconductor film having a chalcopyrite structure provided on the lower electrode. A group 16 element is included in the shading film, the lower electrode and the semiconductor film.

According to the present application example, the group 16 element that is included in the semiconductor film having a chalcopyrite structure is also included in the shading film and the lower electrode. Including the group 16 element in the lower electrode facilitates ohmic contact between the lower electrode and the semiconductor film, and improves the electrical characteristics of the photoelectric conversion apparatus. The shading film prevents light from being incident on the switching element. Including the group 16 element in the shading film lowers the reflectance of the shading film compared with a metal film. Accordingly, since light that is reflected by the shading film is reduced, light reflected by photoelectric conversion parts that are at different locations from the photoelectric conversion part on which light was originally supposed to be incident is reduced. As a result, a photoelectric conversion apparatus that is able to obtain desired images can be provided.

Application Example 2

In the photoelectric conversion apparatus according to the above application example, preferably the group 16 element includes at least one of selenium and sulfur.

According to the present application example, a semiconductor film having a chalcopyrite structure that is able to realize high photoelectric conversion efficiency can be obtained.

Application Example 3 in the photoelectric conversion apparatus according to the above application example, preferably the shading film and the lower electrode include molybdenum (Mo).

According to the present application example, ohmic contact between the lower electrode and the semiconductor film is facilitated, and the electrical characteristics of the photoelectric conversion apparatus improve. Furthermore, a lower electrode having low electrical resistance can be obtained at low cost. Also, molybdenum selenide ($MoSe_2$) or molybdenum sulfide ($MoS_2$) will be included in the shading film. Molybdenum selenide ($MoSe_2$) is a semiconductor having a band gap width of about 1.35 to 1.41 eV, and molybdenum sulfide ($MoS_2$) is a semiconductor having a band gap width of about 1.8 eV. Therefore, the shading film absorbs light having energy greater than or equal to the band gap width, and the reflectance of the shading film decreases. Thus, because light that is reflected by the shading film is reduced, light that is incident on photoelectric conversion parts that are at different locations from the photoelectric conversion part on which light was originally supposed to be incident is reduced. As a result, a photoelectric conversion apparatus that is able to obtain desired images can be provided.

Application Example 4

A method of manufacturing a photoelectric conversion apparatus according to the present application example includes forming a switching element on one surface of a substrate, forming an interlayer insulation film so as to cover the switching element, forming a shading film on the interlayer insulation film in an area overlapping the switching element when seen from a film thickness direction of the substrate, forming a lower electrode on the interlayer insulation film, and forming a semiconductor film having a chalcopyrite structure on the lower electrode. A group 16 element is included in the semiconductor film, and in forming the semiconductor film, the shading film and the lower electrode are caused to react to the group 16 element to form a shading film including the group 16 element and a lower electrode including the group 16 element.

According to the present application example, the group 16 element that is included in the semiconductor film having a chalcopyrite structure is also included in the shading film and the lower electrode. Including the group 16 element in the lower electrode facilitates ohmic contact between the lower electrode and the semiconductor film, and improves the electrical characteristics of the photoelectric conversion apparatus. The shading film prevents light from being incident on the switching element, while including the group 16 element in the shading film lowers the reflectance of the shading film compared with a metal film. Therefore, because light that is reflected by the shading film is reduced, light that is incident on photoelectric conversion parts that are at different locations from the photoelectric conversion part on which light was originally supposed to be incident is reduced. As a result, a photoelectric conversion apparatus that is able to obtain desired images can be provided.

Application Example 5

In the method of manufacturing a photoelectric conversion apparatus according to the above application example, preferably the group 16 element includes at least one of selenium and sulfur.

According to the present application example, a semiconductor film having a chalcopyrite structure that is able to realize high photoelectric conversion efficiency can be obtained.

Application Example 6

In the method of manufacturing a photoelectric conversion apparatus according to the above application example, preferably the shading film and the lower electrode include molybdenum.

According to the present application example, ohmic contact between the lower electrode and the semiconductor film is facilitated, and the electrical characteristics of the photoelectric conversion apparatus improve. Furthermore, a lower electrode having low electrical resistance can be obtained at low cost. Also, $MoSe_2$ or $MoS_2$ will be included in the shading film. $MoSe_2$ is a semiconductor having a band gap width of about 1.35 to 1.41 eV, and $MoS_2$ is a semiconductor having a band gap width of about 1.8 eV. Therefore, the shading film absorbs light having energy greater than or equal to the band gap width, and the reflectance of the shading film decreases. Thus, because light that is reflected by the shading film is reduced, light that is incident on photoelectric conversion parts that are at different locations from the photoelectric conversion part on which light was originally supposed to be incident is reduced. As a result, a photoelectric conversion apparatus that is able to obtain desired images can be provided.

Application Example 7

An electronic device according to the present application example is characterized by being provided with the above-mentioned photoelectric conversion apparatus.

According to the present application example, the electronic device is able to realize high quality images because of being provided with a photoelectric conversion apparatus that is able to obtain desired images such as described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. Note that, in the following diagrams, the scale of the layers and members is differentiated from the actual scale, in order to facilitate recognition of the individual layers and members. Note also that, in the following illustrative embodiments, the phrase "on the substrate", for example, is intended to represent cases where a constituent part or the like is disposed on the substrate in contact therewith, is disposed on the substrate via another constituent part, or is disposed on the substrate partially in contact therewith and partially via another constituent part.

Embodiment 1

Photoelectric Conversion Apparatus

First, an image sensor serving as a photoelectric conversion apparatus of Embodiment 1 will be described with reference to FIGS. 1 to 3.

Figure 1A:
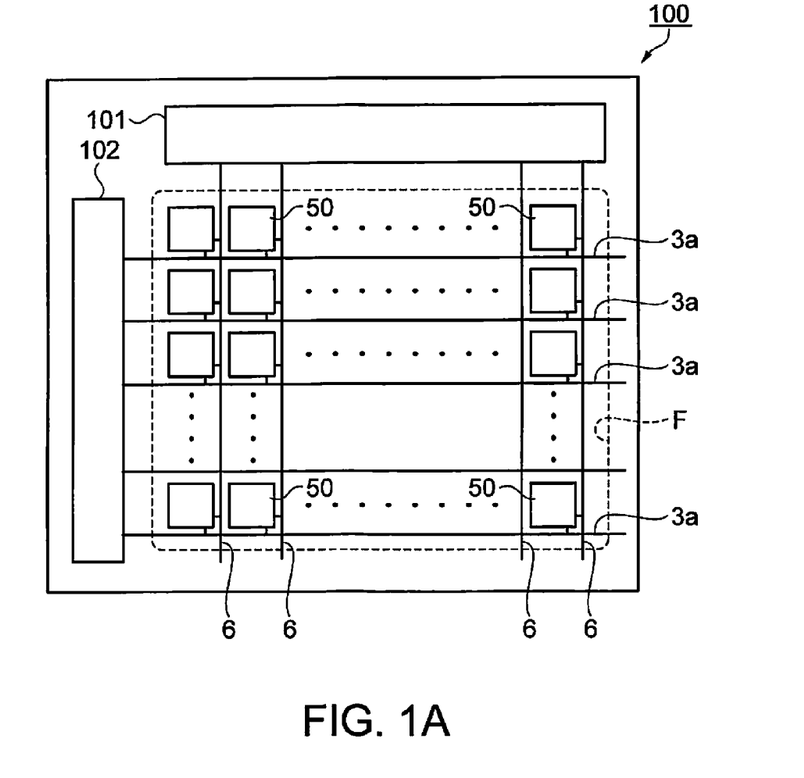
FIGS. 1A and 1B relate to Embodiment 1, with FIG. 1A being a schematic connection diagram of an image sensor serving as a photoelectric conversion apparatus, and FIG. 1B being an equivalent circuit diagram of a photo sensor serving as a photoelectric conversion element.
Figure 1B:
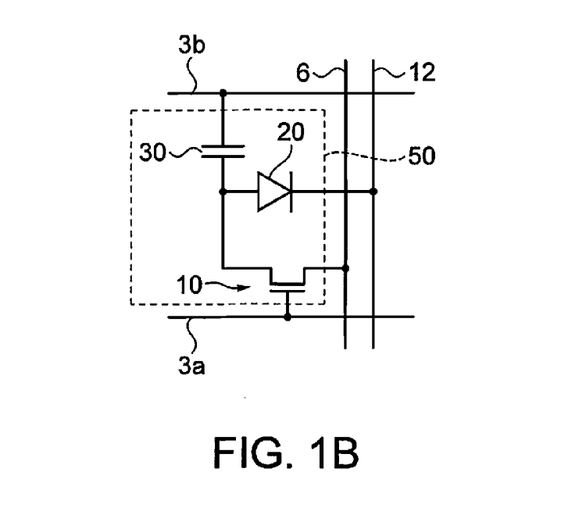

FIG. 1A is a schematic connection diagram showing an electrical configuration of an image sensor serving as a photoelectric conversion apparatus, and FIG. 1B is an equivalent circuit diagram of a photo sensor serving as a photoelectric conversion element. FIG. 2 is a schematic partial plan view showing the arrangement of the photo sensors in the image sensor, and FIG. 3 is a schematic cross-sectional view showing the structure of the photo sensor cut at an A-A' line in FIG. 2.

As shown in FIG. 1A, an image sensor 100 serving as a photoelectric conversion apparatus of the present embodiment has a plurality of scan lines 3a and a plurality of data lines 6 that extend and intersect each other in an element region F. The image sensor 100 also has a scan line circuit 102 to which the plurality of scan lines 3a are electrically connected and a data line circuit 101 to which the plurality of data lines 6 are electrically connected. The image sensor 100 further has a plurality of photo sensors 50 serving as photoelectric conversion elements that are provided corresponding to the vicinity of the intersections of the scan lines 3a and the data lines 6, and are disposed in a matrix in the element region F.

As shown in FIG. 1B, the photo sensors 50 serving as photoelectric conversion elements are constituted to include a thin film transistor (TFT) 10 serving as a switching element, a photodiode 20 serving as a photoelectric conversion part, and a storage capacitor 30. A gate electrode of the TFT 10 is connected to the scan line 3a, and a source electrode of the TFT 10 is connected to the data line 6. One end of the photodiode 20 serving as a photoelectric conversion part is connected to a drain electrode of the TFT 10, and the other end is connected to a constant potential line 12 provided in parallel with the data line 6. One electrode of the storage capacitor 30 is connected to the drain electrode of the TFT 10, and the other electrode is connected to a constant potential line 3b provided in parallel with the scan line 3a.

Figure 2:
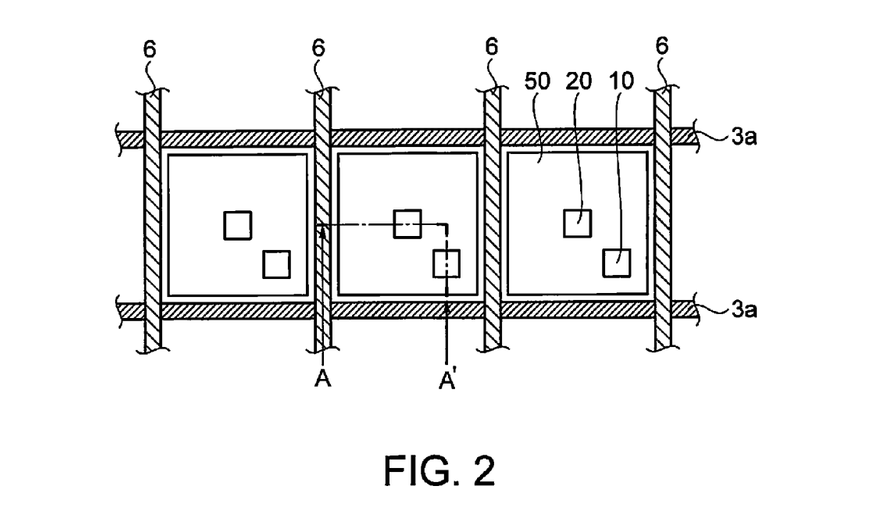
FIG. 2 is a schematic partial plan view showing the arrangement of photo sensors in an image sensor according to Embodiment 1.

As shown in FIG. 2, the photo sensors 50 serving as photoelectric conversion elements are provided in areas planarly partitioned by the scan lines 3a and the data lines 6, and are constituted to include the TFT 10 and the photodiode 20 serving as a photoelectric conversion part. The storage capacitor 30 is not illustrated in FIG. 2.

Figure 3:
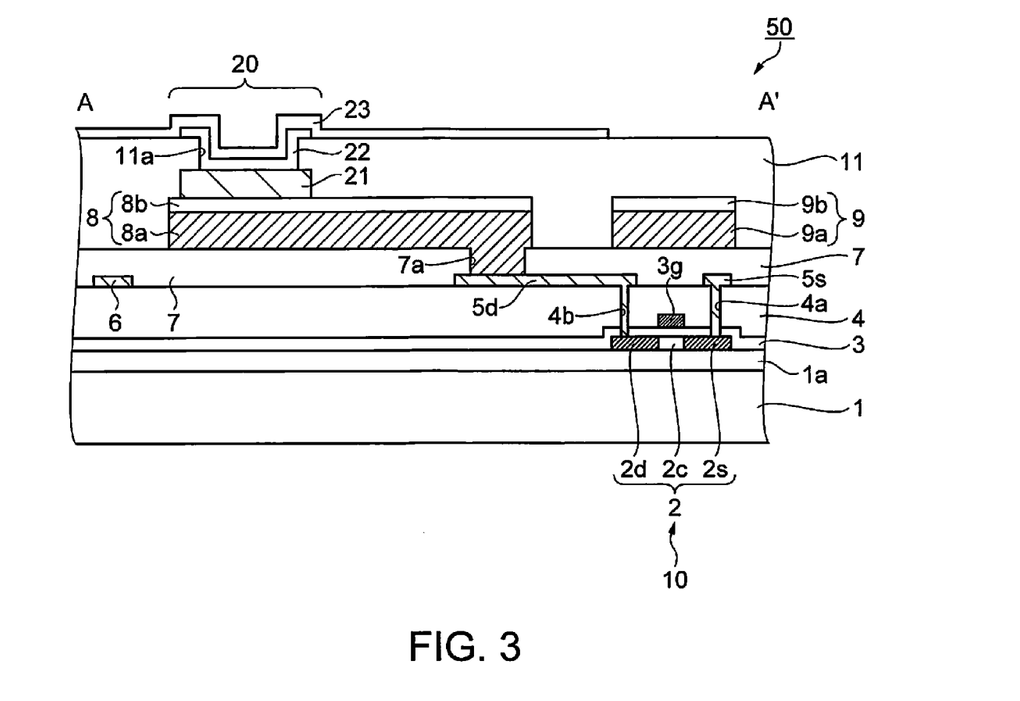
FIG. 3 is a schematic cross-sectional view of a photo sensor cut at an A-A' line in FIG. 2 according Embodiment 1.

As shown in FIG. 3, the photo sensors 50 serving as photoelectric conversion elements are formed on a substrate 1 of transparent glass, opaque silicon or the like, for example.

On the substrate 1, a base insulation film 1a of silicon oxide ($SiO_2$) is formed so as to cover the surface of the substrate 1, and an island-like semiconductor film 2 of polycrystalline silicon having a film thickness of about 50 nm, for example, is formed on the base insulation film 1a. Furthermore, a gate insulation film 3 is formed using an insulating material such as $SiO_2$ having a film thickness of about 100 nm, for example, to cover the semiconductor film 2. Note that, the gate insulation film 3 also covers the base insulation film 1a as well as covering the semiconductor film 2.

A gate electrode 3g is formed on the gate insulation film 3 in a position opposing a channel forming region 2c of the semiconductor film 2. The gate electrode 3g is electrically connected to a scan line 3a shown in FIG. 2, and is formed using a metal material such as molybdenum (Mo) having a film thickness of about 500 nm, for example.

A first interlayer insulation film 4 is formed using $SiO_2$ having a film thickness of about 800 nm to cover the gate electrode 3g and the gate insulation film 3. Contact holes 4a and 4b are formed in portions of the gate insulation film 3 and the first interlayer insulation film 4 that cover a drain region 2d and a source region 2s of the semiconductor film 2. A conductive film made of a metal material such as Mo having a film thickness of about 500 nm, for example, is formed so as to cover the first interlayer insulation film 4 and fill contact holes 4a and 4b, and a drain electrode 5d, a source electrode 5s and a data line 6 are formed by patterning this conductive film. The source electrode 5s is connected to the source region 2s of the semiconductor film 2 through the contact hole 4a, and is also connected to the data line 6. The drain electrode 5d is connected to the drain region 2d of the semiconductor film 2 through the contact hole 4b. The TFT 10 is formed with the drain region 2d, the channel forming region 2c, the source region 2s, and the like.

A second interlayer insulation film 7 serving as an interlayer insulation film is formed to cover the drain electrode 5d, the source electrode 5s, the data line 6, and the first interlayer insulation film 4. The second interlayer insulation film 7 is formed using silicon nitride ($Si_3N_4$) having a film thickness of about 800 nm.

On the second interlayer insulation film 7, a lower electrode 8 of the photodiode 20 serving as a photoelectric conversion part is formed. The lower electrode 8 is formed with an island-like conductive film 8a made of Mo having a film thickness of about 500 nm, and a semiconductor film 8b made of $MoSe_2$ having a film thickness of about 100 nm that is formed on the conductive film 8a and includes the group 16 element selenium (Se). The lower electrode 8 is electrically connected to the drain electrode 5d through a contact hole 7a formed in the second interlayer insulation film.

An island-like shading film 9 is formed on the second interlayer insulation film 7 in an area overlapping the TFT 10 when seen from the thickness direction (film thickness direction) of the films that are formed on the substrate (hereinafter, also referred to as "in plan view"). More specifically, the shading film 9 is formed in an area overlapping the semiconductor film 2 when seen from the film thickness direction of the substrate (in plan view of the substrate). This shading film 9 prevents light from being incident on the TFT 10, and, in particular, prevents light from being incident on the semiconductor film 2. The shading film 9, similarly to the lower electrode 8, is formed with an island-like conductive film 9a made of Mo having a film thickness of about 500 nm, and a semiconductor film 9b made of $MoSe_2$ having a film thickness of about 100 nm that is formed on the conductive film 9a and includes the group 16 element selenium (Se).

On the lower electrode 8, a semiconductor film 21 having a chalcopyrite structure consisting of a CIS film or a CIGS film having a film thickness of about 1 μm is formed.

A third interlayer insulation film 11 is formed so as to cover the second interlayer insulation film 7, the lower electrode 8, the shading film 9, and the semiconductor film 21 having a chalcopyrite structure. The third interlayer insulation film 11 is formed using $Si_3N_4$ having a film thickness of about 500 nm.

An island-like buffer layer 22 is formed so as to connect to the semiconductor film 21 having a chalcopyrite structure through a contact hole 11a formed in the third interlayer insulation film 11. The buffer layer 22 is formed with a cadmium sulfide (CdS) film having a film thickness of about 50 nm. Zinc oxide (ZnO), zinc sulfide (ZnS) or the like may be used instead of CdS.

A transparent electrode 23 is formed on the third interlayer insulation film 11 and the buffer layer 22. The transparent electrode 23 consists of a transparent conductive film of ITO (indium tin oxide), IZO (indium zinc oxide) or the like with a film thickness of about 100 nm, for example. The transparent electrode 23 doubles as the constant potential line 12 shown in FIG. 1B.

The photodiode 20 serving as a photoelectric conversion part is constituted by the lower electrode 8, the semiconductor film 21 having a chalcopyrite structure, the buffer layer 22, and the transparent electrode 23.

In the present embodiment, the circuit part provided on the substrate 1 includes the scan lines 3a, the data lines 6, the constant potential lines 3b and 12, the TFTs 10 and the storage capacitors 30 connected to these interconnects, the data line circuit 101, and the scan line circuit 102 shown in FIGS. 1A and 1B. Note that, the data line circuit 101 to which the data lines 6 are connected and the scan line circuit 102 to which the scan lines 3a are connected can also be respectively attached separately to the substrate 1 as integrated circuits.

According to such an image sensor 100 serving as a photoelectric conversion apparatus, when light is incident on the photodiode 20 serving as a photoelectric conversion part in a state where a reverse bias is applied to the photodiode 20 using the constant potential lines 3b and 12, photoelectric current flows in the photodiode 20, and electric charge accumulates in the storage capacitor 30 according to the amount of photoelectric current.

Also, signals corresponding to the electric charge accumulated in the storage capacitors 30 that are provided in the respective photo sensors 50 are sequentially output to the data lines 6 by turning on (selecting) a plurality of TFTs 10 using each of the plurality of scan lines 3a. Accordingly, the intensity of light received by each photo sensor 50 in the element region F can be respectively detected.

Manufacturing Method of Photoelectric Conversion Apparatus

A method of manufacturing an image sensor serving as a photoelectric conversion apparatus of Embodiment 1 will be described using FIGS. 3 and 4. FIGS. 4A to 4D are schematic partial cross-sectional views showing a manufacturing method of an image sensor serving as a photoelectric conversion apparatus, and are schematic cross-sectional views showing the manufacturing method on the second interlayer insulation film 7.

As shown in FIG. 3, the manufacturing method of the image sensor 100 serving as a photoelectric conversion apparatus involves firstly forming the $SiO_2$ base insulation film 1a using chemical vapor deposition (CVD) or the like on the substrate 1 of transparent glass, opaque silicon or the like. Next, an amorphous silicon film having a film thickness of about 50 nm is formed by CVD or the like on the base insulation film 1a. The amorphous silicon film is crystallized by laser crystallization or the like to form a polycrystalline silicon film. Thereafter, the island-like semiconductor film 2, which is a polycrystalline silicon film, is formed by photolithography or the like.

Next, $SiO_2$ having a film thickness of about 100 nm is formed by CVD or the like so as to cover the semiconductor film 2 and the base insulation film 1a, thus forming the gate insulation film 3. A Mo film having a film thickness of about 500 nm is formed on the gate insulation film 3 by sputtering or the like, and the island-like gate electrode 3g is formed by photolithography. Impurity ions are implanted into the semiconductor film 2 by ion implantation to form the source region 2s, the drain region 2d, and the channel forming region 2c. An $SiO_2$ film having a film thickness of about 800 nm is formed so as to cover the gate insulation film 3 and the gate electrode 3g, thus forming the first interlayer insulation film 4.

Next, the contact holes 4a and 4b that reach the source region 2s and the drain region 2d are formed in the first interlayer insulation film 4. Thereafter, a Mo film having a film thickness of about 500 nm is formed by sputtering or the like on the first interlayer insulation film 4 and in the contact holes 4a and 4b and patterned by photolithography to form the source electrode 5s, the drain electrode 5d, and the data line 6. The TFT 10 is formed by the above processes.

An $Si_3N_4$ film having a film thickness of about 800 nm is formed so as to cover the first interlayer insulation film 4, the source electrode 5s, the drain electrode 5d, and the data line 6, thus forming the second interlayer insulation film 7.

Figure 4A:
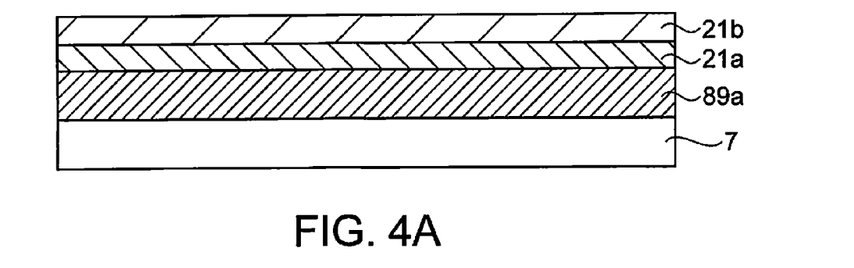
FIGS. 4A to 4D are schematic partial cross-sectional views showing a method of manufacturing a photoelectric conversion apparatus according to Embodiment 1.

The contact hole 7a that reaches the drain electrode 5d is formed in the second interlayer insulation film 7. Thereafter, as shown in FIG. 4A, a Mo film 89a having a film thickness of about 500 nm is formed as a conductive film by sputtering or the like on the second interlayer insulation film 7 and in the contact hole 7a. Thereafter, a Cu—Ga alloy film 21a and an In film 21b are formed by sputtering or the like on the Mo film 89a. The Cu—Ga alloy film 21a and the In film 21b are precursor films that will form the semiconductor film 21 having a chalcopyrite structure by subsequent selenization annealing. The total film thickness of the precursor films is about 500 nm.

Figure 4B:
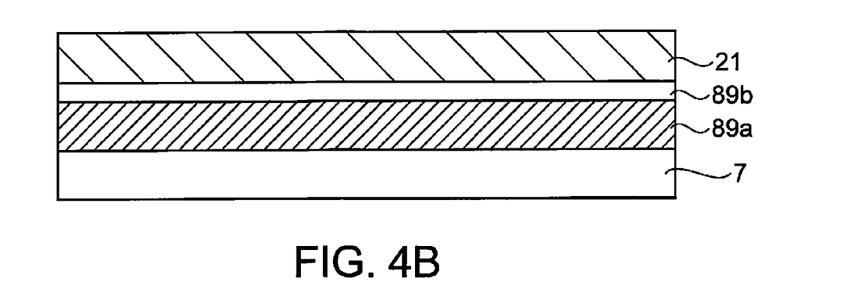

The selenization annealing process will be described with reference to FIG. 4B. After the processes of FIG. 4A are completed, this substrate is subject to selenization annealing such that the Cu—Ga alloy film 21a and the In film 21b, which are precursor films, form the semiconductor film (CIGS film) 21 having a chalcopyrite structure. Selenization annealing is annealing performed at a temperature of about 500° C. in an atmosphere including hydrogen selenide ($H_2Se$) gas. When selenization annealing is performed, the surface of the Mo film 89a is selenized and a $MoSe_2$ film 89b is formed. The film thickness of the $MoSe_2$ film 89b is about 100 nm. Accordingly, the semiconductor film 21 and the $MoSe_2$ film 89b are films including the group 16 element Se.

Figure 4C:
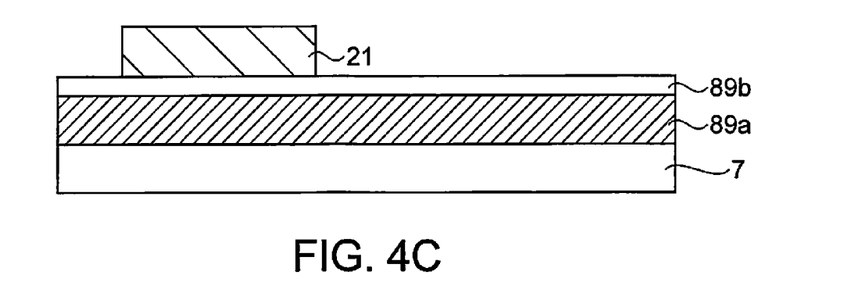

As shown in FIG. 4C, the semiconductor film 21 having a chalcopyrite structure is patterned by photolithography.

Figure 4D:
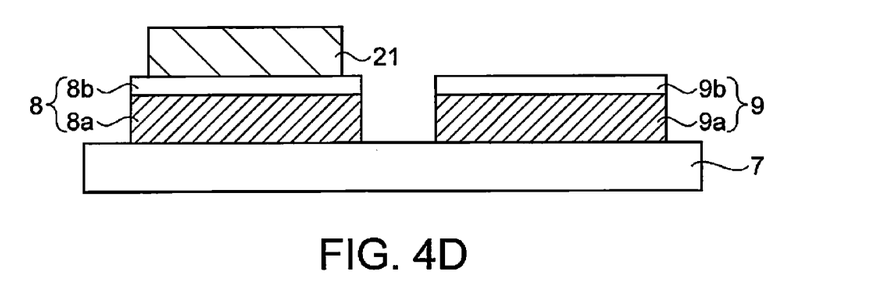

As shown in FIG. 4D, the $MoSe_2$ film 89b and the Mo film 89a are patterned by photolithography to form the lower electrode 8 and the shading film 9.

Next, as shown in FIG. 3, an $Si_3N_4$ film having a film thickness of about 500 nm is formed so as to cover the semiconductor film 21, the lower electrode 8, the shading film 9 and the second interlayer insulation film 7, thus forming the third interlayer insulation film 11. The contact hole 11a that reaches the semiconductor film 21 is formed in the third interlayer insulation film 11. Thereafter, a CdS film having a film thickness of about 50 nm is formed by CBD (chemical bath deposition) or the like on the third interlayer insulation film 11 and in the contact hole 11a and patterned by photolithography to form the buffer layer 22. An ITO film having a film thickness of about 100 nm is formed by sputtering or the like on the third interlayer insulation film 11 and the buffer layer 22, and is patterned by photolithography to form the transparent electrode 23.

The photoelectric conversion apparatus of Embodiment 1 is formed in this manner.

According to abovementioned Embodiment 1, the following effects can be obtained.

In the image sensor serving as such a photoelectric conversion apparatus, the shading film 9 is formed for preventing light from being incident on the TFT 10, and is constituted by the conductive film 9a made of Mo and the semiconductor film 9b made of $MoSe_2$. Because the semiconductor film 9b is a semiconductor having a band gap width of about 1.35 to 1.41 eV, the semiconductor film 9b absorbs light having energy greater than or equal to the band gap width, and the reflectance of the shading film decreases. Thus, because light that is reflected by the shading film is reduced by also forming the semiconductor film including group 16 elements rather than forming the shading film with only a metal material, light that is incident on photoelectric conversion parts that are at different locations from the photodiode 20 on which light was originally supposed to be incident is reduced. As a result, an image sensor serving as a photoelectric conversion apparatus that is able to obtain desired images can be provided.

Selenium is included in the semiconductor film 21. The semiconductor film 21 can thereby be configured to have a chalcopyrite structure that is able to realize high photoelectric conversion efficiency.

Molybdenum (Mo) is included in the lower electrode 8 and the shading film 9. The ohmic contact between the lower electrode 8 and the semiconductor film 21 is thereby facilitated, and the electrical characteristics of the photo sensors 50 installed in the image sensor 100 improve. Furthermore, a lower electrode 8 having low electrical resistance can be obtained at low cost. Also, molybdenum selenide ($MoSe_2$) will be included in the shading film 9. Accordingly, light that is reflected by the shading film 9 can be reduced.

Embodiment 2

Photoelectric Conversion Apparatus

Figure 5:
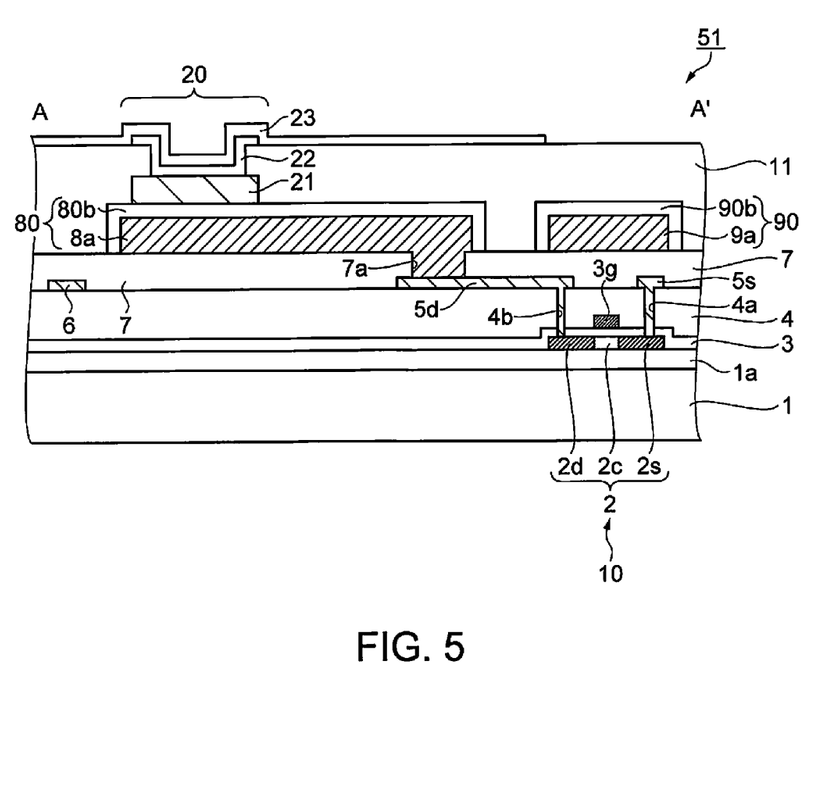
FIG. 5 is a schematic cross-sectional view of a photo sensor cut at an A-A' line in FIG. 2 according to Embodiment 2.

An image sensor serving as a photoelectric conversion apparatus of Embodiment 2 will be described with reference to FIGS. 1, 2 and 5. FIG. 5 is a schematic cross-sectional view showing the structure of a photo sensor cut at an A-A' line in FIG. 2 according to Embodiment 2. Note that the same numerals are used for constituent parts that are the same as Embodiment 1, and redundant description will be omitted.

Embodiment 2 differs from Embodiment 1 in the structure of the lower electrode 8 and the shading film 9, with these constituent parts being referred to as a lower electrode 80 and a shading film 90 in the description of Embodiment 2. As shown in FIG. 5, in an image sensor 51 of Embodiment 2, the lower electrode 80 of the photodiode 20 is formed on the second interlayer insulation film 7. The lower electrode 80 is formed with the island-like conductive film 8a made of Mo having a film thickness of about 500 nm, and a semiconductor film 80b made of $MoSe_2$ having a film thickness of about 100 nm that is formed on the upper surface and lateral surfaces of the conductive film 8a and includes the group 16 element Se.

The island-like shading film 90 is formed on the second interlayer insulation film 7 in an area overlapping the TFT 10 when seen from the film thickness direction of the substrate (in plan view of the substrate). More specifically, the shading film 90 is formed in an area overlapping the semiconductor film 2 when seen from the film thickness direction of the substrate. This shading film 90 prevents light from being incident on the TFT 10, and, in particular, prevents light from being incident on the semiconductor film 2. The shading film 90, similarly to the lower electrode 80, is formed with the island-like conductive film 9a made of Mo having a film thickness of about 500 nm, and a semiconductor film 90b made of $MoSe_2$ having a film thickness of about 100 nm that is formed on the upper surface and lateral surfaces of the conductive film 9a and includes the group 16 element Se. Apart from the structure of the lower electrode 80 and the shading film 90, Embodiment 2 is the same as Embodiment 1.

Manufacturing Method of Photoelectric Conversion Apparatus

The manufacturing method of an image sensor serving as a photoelectric conversion apparatus of Embodiment 2 will be described using FIGS. 5 and 6.

FIGS. 6A to 6E are schematic partial cross-sectional views showing a manufacturing method of an image sensor serving as a photoelectric conversion apparatus, and are schematic cross-sectional views showing the manufacturing method on the second interlayer insulation film 7. Embodiment 2 differs from Embodiment 1 in the structure of the lower electrode 80 and the shading film' 90. Since the processes up to forming the second interlayer insulation film 7 are the same as Embodiment 1, description thereof will be omitted.

Figure 6A:
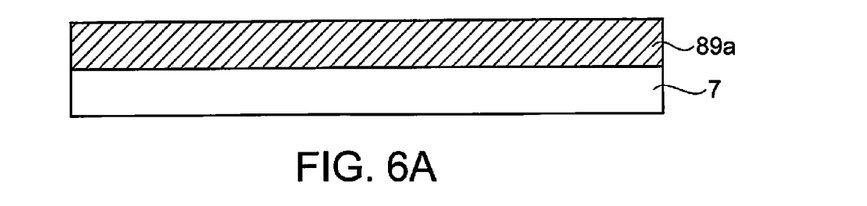
FIGS. 6A to 6E are schematic partial cross-sectional views showing a method of manufacturing a photoelectric conversion apparatus according to Embodiment 2.

As shown in FIG. 6A, the Mo film 89a having a film thickness of about 500 nm is formed as a conductive film by sputtering or the like on the second interlayer insulation film 7 and in the contact hole 7a.

Figure 6B:
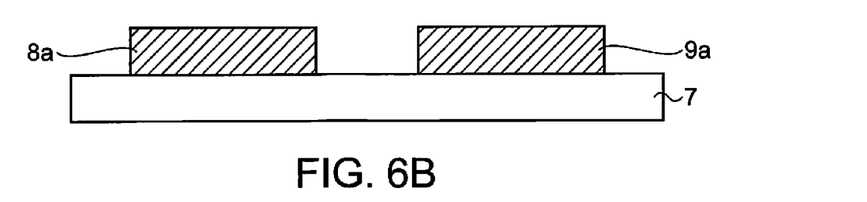

As shown in FIG. 6B, the Mo film 89a is patterned by photolithography to form the conductive film 8a made of Mo that will form part of the lower electrode 80 and the conductive film 9a made of Mo that will form part of the shading film 90.

Figure 6C:
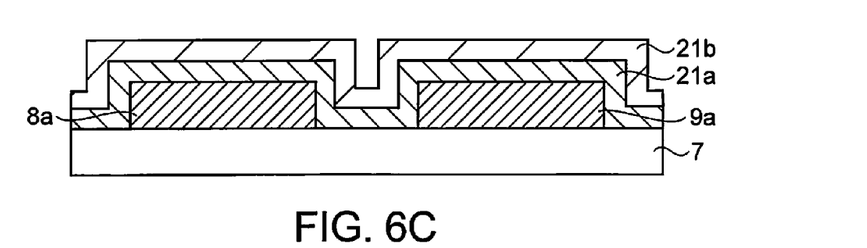

As shown in FIG. 6C, the Cu—Ga alloy film 21a and the In film 21b are formed by sputtering or the like, so as to cover the second interlayer insulation film 7, the conductive film 8a and the conductive film 9a. The Cu—Ga alloy film 21a and the In film 21b are precursor films that will form the semiconductor film 21 having a chalcopyrite structure by subsequent selenization annealing. The total film thickness of the precursor films is about 500 nm.

Figure 6D:
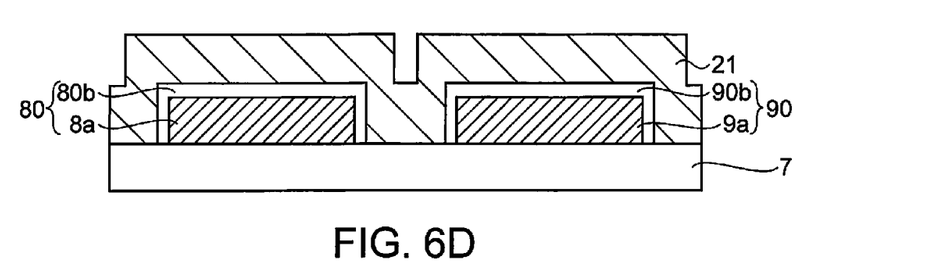
Figure 6E:
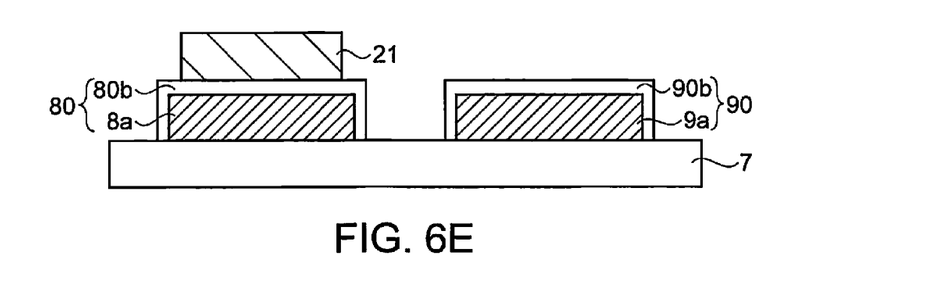

The selenization annealing process will be described with reference to FIG. 6D. After the processes of FIG. 6C are completed, this substrate is subject to selenization annealing such that the Cu—Ga alloy film 21a and the In film 21b, which are precursor films, form the semiconductor film 21 having a chalcopyrite structure. Selenization annealing is annealing performed at a temperature of about 500° C. in an atmosphere including $H_2Se$ gas. When selenization annealing is performed, the upper surface and the lateral surfaces of the conductive film 8a and the conductive film 9a are selenized and the semiconductor films 80b and 90b made of $MoSe_2$ are formed. The film thickness of the semiconductor films 80b and 90b is about 100 nm. The lower electrode 80 and the shading film 90 in which the semiconductor films 80b and 90b made of $MoSe_2$ are provided on the upper surface and the lateral surfaces of the conductive films 8a and 9a made of Mo are formed in this manner. As shown in FIG. 6E, the semiconductor film 21 having a chalcopyrite structure is patterned by photolithography. The subsequent processes are the same as Embodiment 1. The photoelectric conversion apparatus of Embodiment 2 is formed in this manner.

According to abovementioned Embodiment 2, the following effects can be obtained.

In such an image sensor serving as a photoelectric conversion apparatus, the shading film 90 is formed for preventing light from being incident on the TFT 10, and is constituted by the conductive film 9a and the semiconductor film 90b. In Embodiment 2, the semiconductor film 90b is not only formed on the upper surface of the conductive film 9a but also on the lateral surfaces. Because the semiconductor film 90b is a semiconductor having a band gap width of about 1.35 to 1.41 eV, the semiconductor film 90b absorbs light having energy greater than or equal to the band gap width, and the reflectance of the upper surface and the lateral surfaces of the shading film 90 decreases. Thus, because light that is reflected by the shading film 90 is reduced by also forming the semiconductor film 90b including group 16 elements rather than forming the shading film 90 with only a metal material, light that is incident on photoelectric conversion parts that are at different locations from the photoelectric conversion part on which light was originally supposed to be incident is reduced. In Embodiment 2, because the upper surface and lateral surfaces of the shading film 90 are constituted by the semiconductor film 90b including group 16 elements, reflection of light by the shading film 90 is reduced compared with Embodiment 1. As a result, an image sensor serving as a photoelectric conversion apparatus that is able to obtain desired images can be provided.

Embodiment 3

Biometric Authentication Apparatus

Figure 7A:
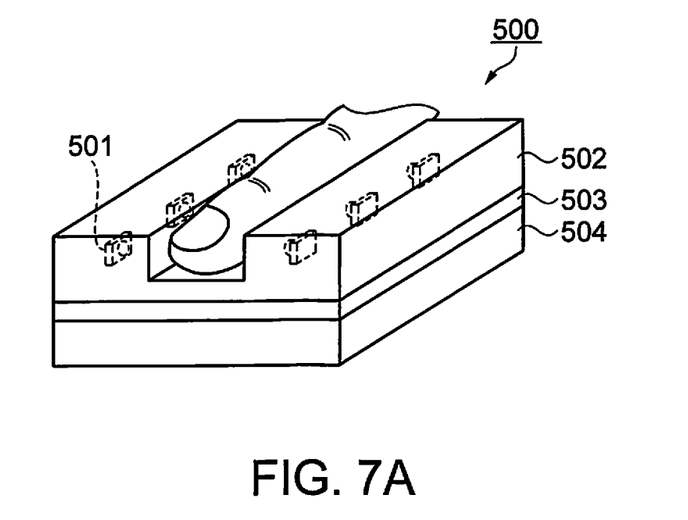
FIG. 7A is a schematic perspective view showing a biometric authentication apparatus serving as an electronic device.

Next, a biometric authentication apparatus serving as an electronic device of the present embodiment will be described with reference to FIGS. 7A and 7B. FIG. 7A is a schematic perspective view showing the biometric authentication apparatus, and FIG. 7B is a schematic cross-sectional view.

Figure 7B:
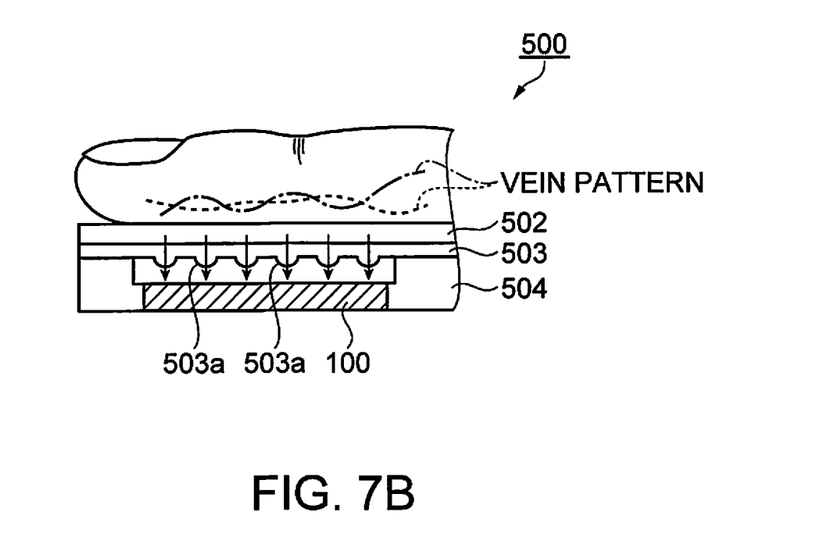
FIG. 7B is a schematic cross-sectional view of the biometric authentication apparatus serving as an electronic device.

As shown in FIGS. 7A and 7B, a biometric authentication apparatus 500 serving as an electronic device of the present embodiment is an apparatus that identifies and authenticates a person whose finger is held up to the biometric authentication apparatus 500, by optically detecting (imaging) the vein pattern of the finger, and comparing the detected vein pattern with the vein pattern of each person who has been registered. Specifically, the biometric authentication apparatus 500 is provided with a subject receiving part 502 having a groove for placing a finger that is held up to the biometric authentication apparatus 500 in a predetermined location, an imaging part 504 to which the image sensor 100 serving as a photoelectric conversion apparatus of the above embodiment is attached, and a micro lens array 503 disposed between the subject receiving part 502 and the imaging part 504.

A plurality of light sources 501 are built into the subject receiving part 502 so as to be disposed on both sides along the groove. In order to image the vein pattern without being affected by outside light, light emitting diodes (LED), EL elements or the like, for example, that emit near-infrared light other than visible light are used for the light sources 501. The vein pattern in the finger is illuminated by the light sources 501, and the image light thereof is focused towards the image sensor 100 by micro lenses 503a provided in the micro lens array 503. The micro lens 503a may be provided in correspondence with each photo sensor 50 of the image sensor 100, or may be provided so as to be paired with a plurality of photo sensors 50.

Note that an optical compensation plate that compensates for luminance unevenness in the light illuminated by the plurality of light sources 501 may be provided between the subject receiving part 502 incorporating the light sources 501 and the micro lens array 503. According to such a biometric authentication apparatus 500, the image sensor 100 which receives near-infrared light and is capable of accurately outputting the illuminated vein pattern as an image pattern is provided, enabling a living body (human body) to be reliably authenticated.

The image sensor 100 of Embodiment 1 or the image sensor 51 of Embodiment 2 is used for the image sensor 100. Accordingly, the biometric authentication apparatus 500 is an apparatus in which the image sensor 100 is able to obtain desired images.

Note that the invention is not limited to the abovementioned embodiments, and it is possible to apply various changes, improvements and the like to the abovementioned embodiments. Modifications are described below.

Modification 1

In the image sensor 100 and the image sensor 51 of the above embodiments, the electrical configuration of the photo sensor 50 and connection thereof are not limited thereto. For example, the electrical output from the photodiode 20 may be connected to the gate electrode 3g of the TFT 10, and received light may be detected as the change in voltage or current between the source electrode 5s and the drain electrode 5d.

Modification 2

In the image sensor 100 of the above embodiments, the group 16 element that is included in the semiconductor film 21 having a chalcopyrite structure, the shading films 9 and 90, and the lower electrodes 8 and 80 is given as selenium (Se), but is not necessarily limited to Se. For example, the group 16 element may be sulfur (S), the semiconductor film having a chalcopyrite structure may be a CIS film, and the shading film may be constituted by a Mo film and a $MoS_2$ film. Also, the two group 16 elements Se and S may be included in the semiconductor film having a chalcopyrite structure, the shading film, and the lower electrode. Alternatively, tellurium may be used as the group 16 element.

A semiconductor film having a chalcopyrite structure that is able to realize high photoelectric conversion efficiency can also be obtained at this time. Molybdenum sulfide ($MoS_2$) is a semiconductor having a band gap width of about 1.8 eV. Therefore, the shading film absorbs light having energy greater than or equal to the band gap width, and the reflectance of the shading film decreases. Thus, because light that is reflected by the shading film is reduced, light that is incident on photoelectric conversion parts that are at different locations from the photoelectric conversion part on which light was originally supposed to be incident is reduced. As a result, a photoelectric conversion apparatus that is able to obtain desired images can be provided.

Modification 3

In the method of manufacturing the photoelectric conversion apparatus of the above embodiments, the precursor films are given as the Cu—Ga alloy film 21a and the In film 21b, but are not limited thereto. For example, a Cu film may be formed instead of a Cu—Ga alloy film. In this case, the semiconductor film having a chalcopyrite structure will be a CIS film. Also, the order in which the films are formed may be changed, with the Cu—Ga alloy film or the Cu film being formed after forming the In film. Furthermore, the number of layers may be increased, and multiple layers of the Cu—Ga alloy film and the In film may be formed. Also, rather than laminating films, a Cu—In—Ga alloy film or a Cu—In alloy film may be formed.

Modification 4

The electronic device to which the image sensor 100 of the above embodiments is mounted is not limited to the biometric authentication apparatus 500. For example, the image sensor 100 can also be applied to a solid-state imaging apparatus that images fingerprints or the iris of the eye.

What is claimed is:
1. A photoelectric conversion apparatus comprising:
a switching element provided on one surface of a substrate;
an interlayer insulation film provided so as to cover the switching element;

a shading film provided on the interlayer insulation film in an area overlapping the switching element when seen from a film thickness direction of the substrate;

a lower electrode provided on the interlayer insulation film; and a semiconductor film having a chalcopyrite structure provided on the lower electrode, wherein at least one of selenium or sulfur is included in the shading film, the lower electrode and the semiconductor film.

2. The photoelectric conversion apparatus according to claim 1, wherein the shading film and the lower electrode include molybdenum.

3. An electronic device comprising the photoelectric conversion apparatus according to claim 1.

4. An electronic device comprising the photoelectric conversion apparatus according to claim 2.

* * * * *